United States Patent
Krohn et al.

(10) Patent No.: US 10,797,221 B2
(45) Date of Patent: Oct. 6, 2020

(54) METHOD FOR MANUFACTURING AN ASSEMBLY FOR AN ULTRASONIC PROBE

(71) Applicant: General Electric Company, Schenectady, NY (US)

(72) Inventors: Matthew Harvey Krohn, Reedsville, PA (US); Sven Runte, Grevenbroich (DE); Vadim Bromberg, Niskayuna, NY (US); Kwok Pong Chan, Niskayuna, NY (US); Alexander Felix Fiseni, Cologne (DE); Mihirkumar Pravinbhai Patel, Manjalpur (IN)

(73) Assignee: Baker Hughes, a GE Company, LLC, Houston, TX (US)

( * ) Notice: Subject to any disclaimer, the term of this patent is extended or adjusted under 35 U.S.C. 154(b) by 659 days.

(21) Appl. No.: 15/441,787

(22) Filed: Feb. 24, 2017

(65) Prior Publication Data
US 2018/0243793 A1   Aug. 30, 2018

(51) Int. Cl.
*H04R 31/00* (2006.01)
*H01L 41/25* (2013.01)
(Continued)

(52) U.S. Cl.
CPC ............ *H01L 41/25* (2013.01); *G10K 11/002* (2013.01); *G10K 11/02* (2013.01)

(58) Field of Classification Search
CPC ...... H01L 41/25; G10K 11/02; G10K 11/002; B06B 1/06
See application file for complete search history.

(56) References Cited

U.S. PATENT DOCUMENTS 5,127,410 A * 7/1992 King .................... G01N 29/221
                                                              310/335
5,176,140 A * 1/1993 Kami ....................... A61B 8/12
                                                               310/327
(Continued)

FOREIGN PATENT DOCUMENTS

JP       2007-235795 A    9/2007
KR    10-2013-0085226 A    7/2013
WO       2015/191775 A1   12/2015

OTHER PUBLICATIONS

International Search Report and Written Opinion issued in connection with corresponding PCT Application No. PCT/US2018/016392 dated Jul. 23, 2018.

*Primary Examiner* — Paul D Kim
(74) *Attorney, Agent, or Firm* — Mintz Levin Cohn Ferris Glovsky and Popeo, P.C.

(57) ABSTRACT

Assemblies for an ultrasonic probe and manufacturing methods are presented. In one example, the method includes additively forming first portions of the assembly using a first material with first acoustic properties and second portions of the assembly using a second material with second acoustic properties, the first and second acoustic properties being configured to modify ultrasonic signals of the ultrasonic probe. In another aspect, a housing for an ultrasonic probe is presented. The housing includes additively-formed portions, a fluid channel, and at least one cavity. The first additively-formed portions include a first material with first acoustic properties. The second additively-formed portions include a second material with second acoustic properties. The first and second acoustic properties are configured to modify ultrasonic signals of the ultrasonic probe. The fluid channel is for receiving fluid within the housing of the ultrasonic probe.

16 Claims, 12 Drawing Sheets

(51) Int. Cl.
    *G10K 11/00*     (2006.01)
    *G10K 11/02*     (2006.01)

(56) References Cited

U.S. PATENT DOCUMENTS

| | | | |
|---|---|---|---|
| 6,551,247 B2* | 4/2003 | Saito | B06B 1/067 |
| | | | 310/322 |
| 8,438,928 B2* | 5/2013 | Frederick | G01N 29/07 |
| | | | 73/627 |
| 9,091,638 B2* | 7/2015 | Frederick | G01N 29/07 |
| 9,237,880 B2* | 1/2016 | Davidsen | B06B 1/0629 |
| 10,076,392 B2* | 9/2018 | Pitts | A61K 47/64 |
| 2011/0114303 A1* | 5/2011 | Rhim | A61B 8/00 |
| | | | 165/185 |
| 2011/0122727 A1* | 5/2011 | Gleitman | E21B 36/02 |
| | | | 367/81 |
| 2012/0112604 A1 | 5/2012 | Hasegawa | |
| 2015/0071030 A1* | 3/2015 | Hayashi | G01S 7/52023 |
| | | | 367/7 |
| 2015/0311424 A1 | 10/2015 | Krohn et al. | |
| 2016/0361670 A1 | 12/2016 | Lipkens et al. | |

\* cited by examiner

METHOD FOR MANUFACTURING AN ASSEMBLY FOR AN ULTRASONIC PROBE

BACKGROUND

The subject matter disclosed herein relates to assemblies for ultrasonic probes, such as housings, transducer backing material and wedges, and manufacturing methods thereof.

When inspecting objects using an ultrasonic probe, the ultrasonic probe may be enclosed in a housing. The housing can contain fluid optimized paths for fluids that transmits the ultrasonic signals produced by the ultrasonic probe or fluids for creating a water jet in front of the transducer to remove air bubbles that could disturb the ultrasonic signals. In addition, wedges may be used to position an ultrasonic probe against a target object, so that inspection may be performed at a variety of different inspection angles. Further, the housing or wedges may include features that are designed to shape ultrasonic beams for inspection. Housings, wedges, and other ultrasonic assemblies must be carefully constructed to include particular acoustic and/or fluidic properties.

For example, a housing may be constructed of materials that reduce unwanted ultrasound reflections that could interfere with the operation of the probe. In addition, an ultrasonic wedge may be required to absorb a certain amount of ultrasonic energy that propagates in such a way as to potentially interfere with ultrasonic energy transmitted and reflected at a particular inspection angle. Further, an ultrasonic assembly may function more efficiently if the acoustic properties are matched to the acoustic properties at the surface of an object under inspection.

In addition to acoustic properties, ultrasonic housings that contain ultrasonic probes may be filled with fluid during operation so that the ultrasonic waves may propagate uniformly toward an object under inspection.

The combination of these acoustic and fluidic requirements leads to increased costs of ultrasonic assemblies, as well as long lead times in the provision of custom assemblies or wedges designed for specific applications. Therefore, a need exists for enhanced techniques for constructing ultrasonic probe assemblies.

SUMMARY

Assemblies for an ultrasonic probe and manufacturing methods are presented. In one example, the method includes additively forming first portions of the assembly using a first material with first acoustic properties and second portions of the assembly using a second material with second acoustic properties, the first and second acoustic properties being configured to modify ultrasonic signals of the ultrasonic probe.

In another aspect, a housing for an ultrasonic probe is presented. The housing includes additively-formed portions, a fluid channel, and may include at least one cavity. The first additively-formed portions include a first material with first acoustic properties. The second additively-formed portions include a second material with second acoustic properties. The first and second acoustic properties are configured to modify ultrasonic signals of the ultrasonic probe. The fluid channel is for guiding fluid through the housing of the ultrasonic probe.

An advantage that may be realized in the practice of some disclosed embodiments of the method is that application specific ultrasonic assembly housings having specific properties may be manufactured either from a single material or from multiple materials, at reduced cost and lead time.

The above embodiments are exemplary only. Other embodiments are within the scope of the disclosed subject matter.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the disclosed subject matter encompasses other embodiments as well. The drawings are not necessarily to scale, emphasis generally being placed upon illustrating the features of certain embodiments of the invention. In the drawings, like numerals are used to indicate like parts throughout the various views.

DETAILED DESCRIPTION

Embodiments of the disclosed subject matter provide techniques for ultrasonic inspection, including the use of ultrasonic assemblies, such as ultrasonic housings, having acoustic and fluidic properties designed for particular applications. Other embodiments are within the scope of the disclosed subject matter.

The present disclosure provides, in part, the use of additive manufacturing techniques, i.e., 3D printing technologies, to create structures with tailored acoustic and fluidic properties. Advantageously, the techniques disclosed herein allow for the printing of parts, such as ultrasonic assemblies, to include regions of different acoustic properties and to allow the forming of complex flow optimized fluid channels. The ultrasonic assemblies may be manufactured under precise digital control of a 3D printer to achieve tailored properties, for example, by including different portions with different acoustic properties.

By way of explanation, the acoustic properties of an ultrasonic housing include velocity, attenuation, and impedance. Specifically, by manufacturing ultrasonic assemblies with different regions having different properties, ultrasonic energy generated by a contained or adjacent ultrasonic probe may be controlled to avoid unwanted reflections. Ultrasonic assemblies include ultrasonic probe wedges, backing material, cases/housings, and single, dual or phased array transducers. As a further advantage, the ultrasonic assemblies may be used in ultrasonic applications where it is desired to guide the energy and/or optimize mode conversion, introduce delays, etc. The techniques may be used to manufacture a wide variety of ultrasonic assemblies, including wedges and assemblies for single or dual transducers, or for phased array transducers.

Figure 1:
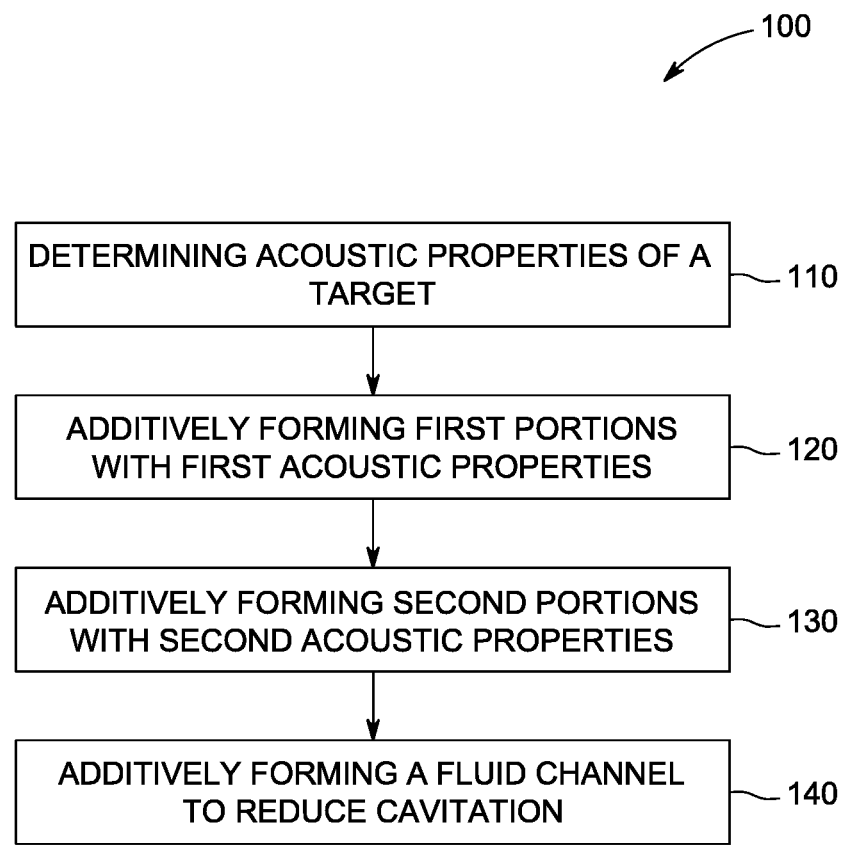
FIG. 1 is a flowchart of an exemplary method for manufacturing an assembly for an ultrasonic probe.

FIG. 1 is a flowchart of an exemplary method 100 for manufacturing an assembly for an ultrasonic probe. In one embodiment, the method 100 at block 110 determines acoustic properties of a target of the ultrasonic probe. For instance, a known target type could be analyzed, and a custom wedge or housing may be designed to be compatible with that target type.

Next, the method 100 at block 120 may additively form first portions of the housing using a first material with first acoustic properties. In addition, the method 100 at block 130 may additively form second portions of the housing using a second material with second acoustic properties. The first and second acoustic properties may be configured to modify ultrasonic signals of the ultrasonic probe. Further, the method 100 at block 140 may additively form a fluid channel for receiving fluid within the housing of the ultrasonic probe. In another example, at least one cavity within the housing may be included.

In one embodiment, the method 100 at block 120 may additively form the assembly in such a way that the first material and the second material are a same material and the additively forming at blocks 130, 140 includes forming the first portions with a first phase of the same material and the second portions with a second phase of the same material.

In another embodiment, the method 100 at block 120 may use materials such that the first phase comprises a first volume percentage of the same material and the second phase comprises a second volume percentage of the same material. For example, the first material and the second material are different materials.

The method 100 at block 120 may configure the first and second acoustic properties of the assembly to reduce ultrasonic reflections from the ultrasonic probe. In other embodiments, three or more different parts may be provided with different materials having different properties, as explained below with reference to FIG. 2A-E.

In one example, the at least one cavity may be configured to reduce cavitation of the fluid in the housing caused by ultrasonic signals of the ultrasonic probe. Advantageously, the shape and size of the cavity may be formed specifically for such an application.

Figure 2A:
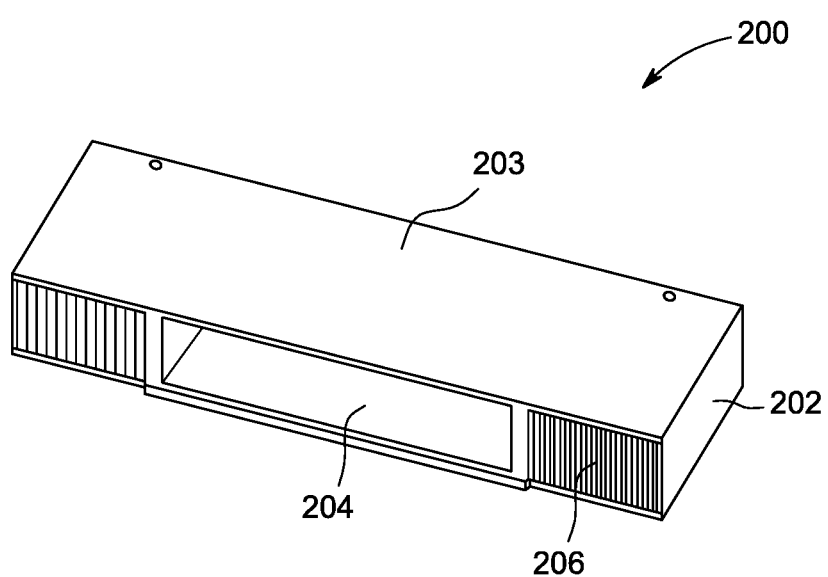
FIGS. 2A-2D depict an exemplary ultrasonic housing.

FIG. 2A depicts an exemplary ultrasonic probe housing 200. The housing 200 includes an opening 204 which can house an ultrasonic probe (e.g. transducer membrane, backing material). A top section 203 and outer walls 202 are used to contain an ultrasonic probe within the housing 200. Sound reflectors 206 can be positioned at a specific location, such as in front of the ultrasonic probe, and may be designed to shape the ultrasonic signals in order to allow inspection of a target specimen at a variety of different inspection angles, depending on the shape and configuration of the sound reflectors 206. For example, FIG. 2A depicts two sound reflectors 206 on either side of opening 204. The sound reflectors 206 each have a number of vertical segments. In other embodiments, several sound reflectors may be placed in different positions at the front or the side of the housing 200, and may include different numbers or vertical and/or horizontal segments, depending upon the shaping of the ultrasonic signals that is desired. Advantageously, a 3D printing process may be used to readily produce such different designs.

In one embodiment, the ultrasonic probe housing 200 may be additively manufactured so that a single unitary 3D printing process may be used to form the sound reflectors 206 along with other features described below, leading to a reduction of material cost and overall manufacturing time for the ultrasonic probe housing 200.

Figure 2B:
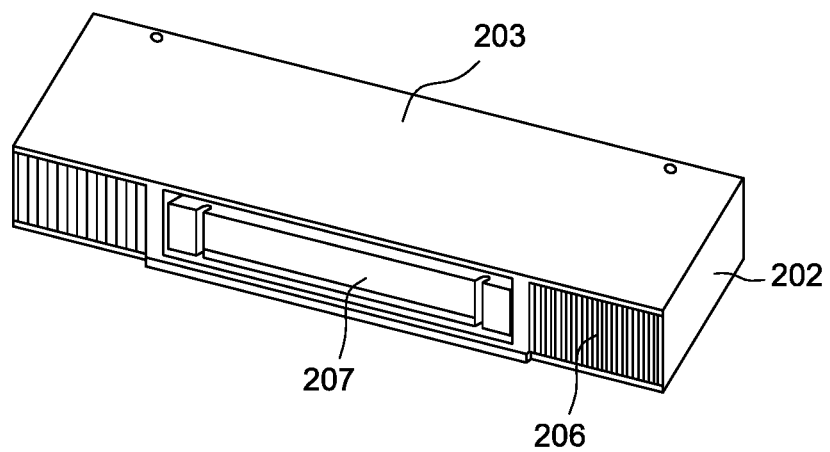

FIG. 2B depicts a damping block 207, which is installed in opening 204 (see FIG. 2A). In one example, damping block 207 may be 3D printed, and may include tailored acoustic properties for transducer damping.

Figure 2C:
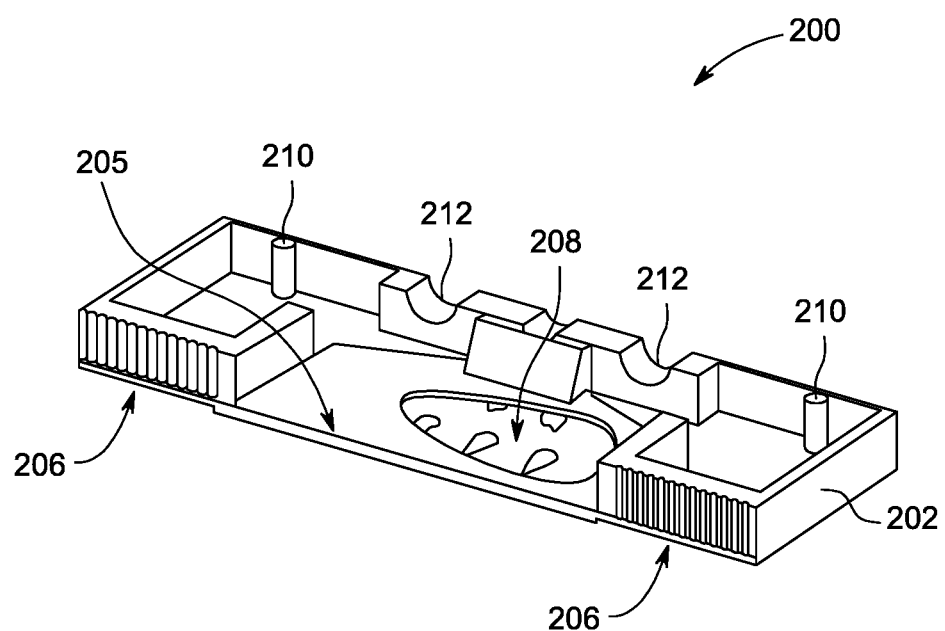

FIG. 2C depicts the interior of the housing 200 upon removal of the top section 203 (see FIG. 2A). A fluid channel 205 is positioned at the front of the housing 200, and may be used to channel fluids such as water or air. The fluid channel 205 allows for removal of air bubbles in front of the ultrasonic housing 200 or ultrasonic transducer which could otherwise interfere with measurements taken by the ultrasonic probe. In addition, the fluid channel 205 can be used to deliver a coupling medium such as water between the front of the housing 200 (and the ultrasonic probe) and a specimen being inspected.

In the embodiment of FIG. 2C, the fluid channel 205 may be additively manufactured along with the sound reflectors 206, and certain other features that provide acoustic properties and/or fluidic properties to the ultrasonic probe housing 200. For instance, a cavity 208 may be formed to help avoid turbulent water flow in front of the housing 200 during removal of air bubbles. Additive manufacturing methodology enables integration of cavities of various shapes, such as the cavity 208, which support optimized water flow. By contrast, conventional subtractive manufacturing techniques, such as milling or machining cannot form precise cavities with arbitrary curved shapes such as the cavity 208. In another example, water flow may be used to prevent air bubbles from forming.

Other features such as screw holes 210, caps, solder tails, separators for cabling, and probe mounts may be additively manufactured along with the sound reflectors 206, the cable opening 212, the fluid channel 205, and the cavity 208. As an advantage of the use of additive manufacturing techniques, each of the specific features can be calculated to have specific dimensions so that weight and robustness of the housing 200 is optimized.

Figure 2D:
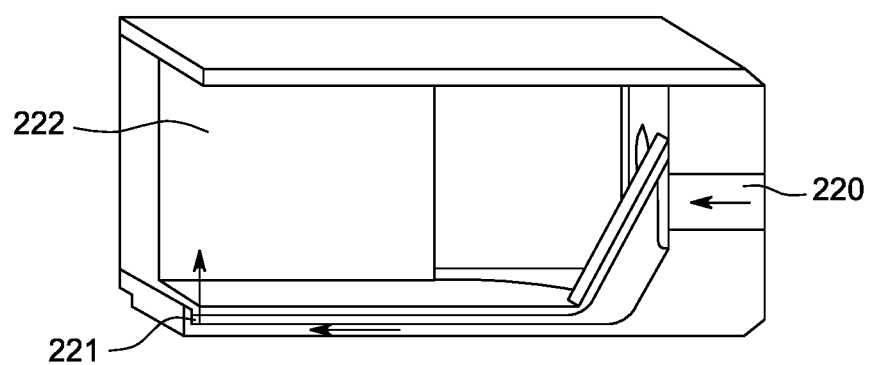

FIG. 2D depicts further detail (in cross-section) of an ultrasonic probe housing 222, including a fluid channel 220 for receiving fluid within the housing 222. In the example of FIG. 2D, the fluid channel 220 is designed to include a lower section 221, and optimizes the water flow with respect to laminar flow and maximum throughput.

Figure 2E:
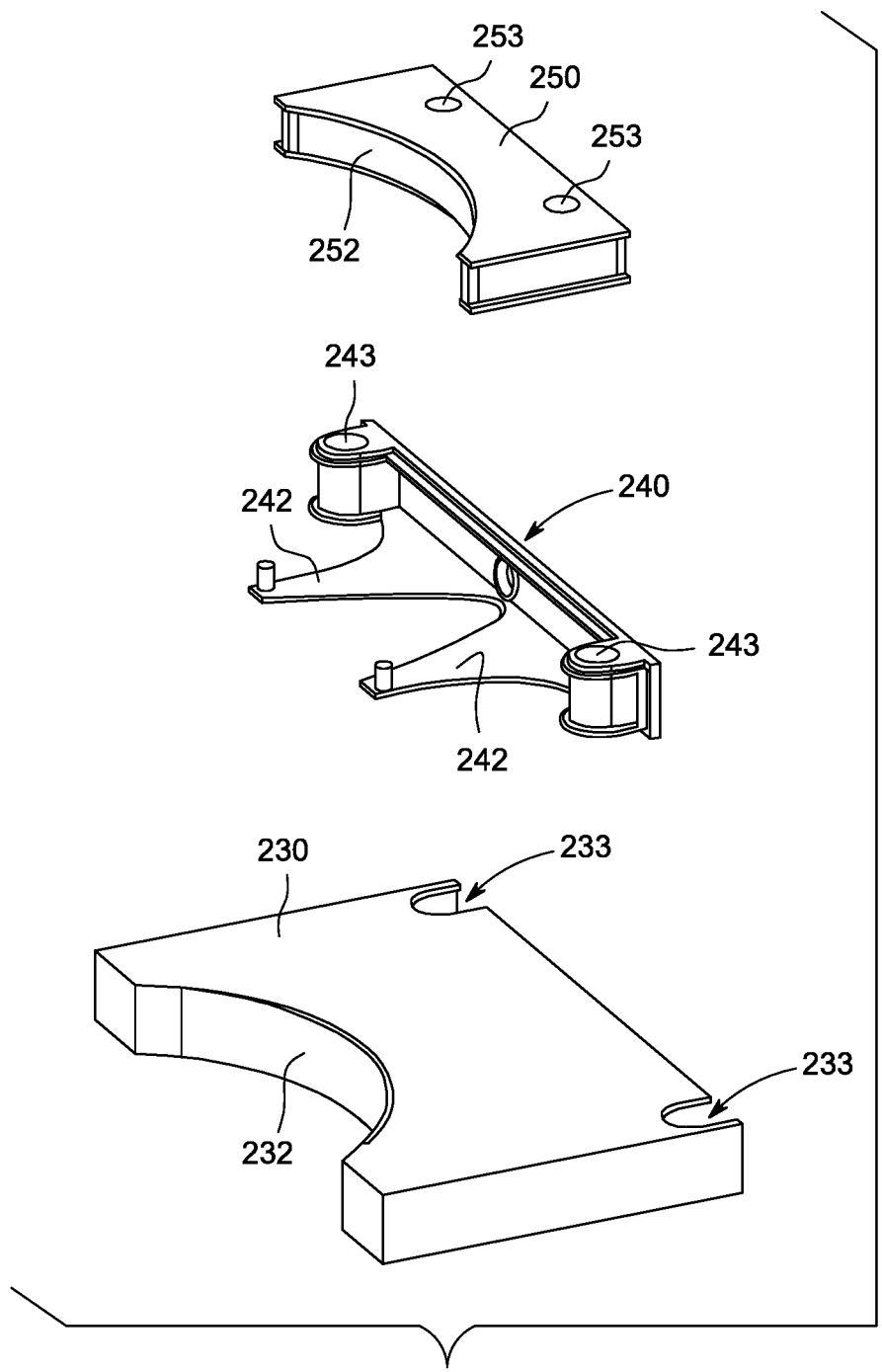
FIG. 2E depicts an exemplary ultrasonic housing.

FIG. 2E depicts an additively manufactured probe housing 230 using multiple materials. For example, the housing 230 may include a connection block 240 and a damping block 250. In one example, different materials may be used for each component. For instance, the housing 230 may be printed using a plastic material, the connection block 240 may be printed using a metal, and the damping block 250 may be printed with either a metal, plastic, or a combination thereof.

The housing 230 may include a membrane 232, which may be additively formed to have specific acoustic properties. In addition, damping block 250 may be formed with a membrane 252 which has special acoustic properties.

In addition to the advantages noted above with respect to FIGS. 2A-2E, using additive manufacturing methods allows for optimization of the functional interaction of the number of gluing steps during assembly, the use of interchangeable parts, and integrated functions, leading to a cost optimization in assembly time and material cost, even while the functionality is increased.

In another embodiment, a hybrid combination of additive manufacturing methods with conventional manufacturing, as well as a combination of different materials can be used to generate an ultrasonic probe housing or assembly. In such a case, the assembly can include a main structure which is robust and waterproof and includes easy mounting for an ultrasonic transducer unit (e.g. made of stainless steel). Hybrid techniques may include imprinted structures for water channels, and different additive manufacturing preparation parameters for varying material properties such as porosity and hardness, for example, to tune ultrasound damping and reflection.

Figure 3A:
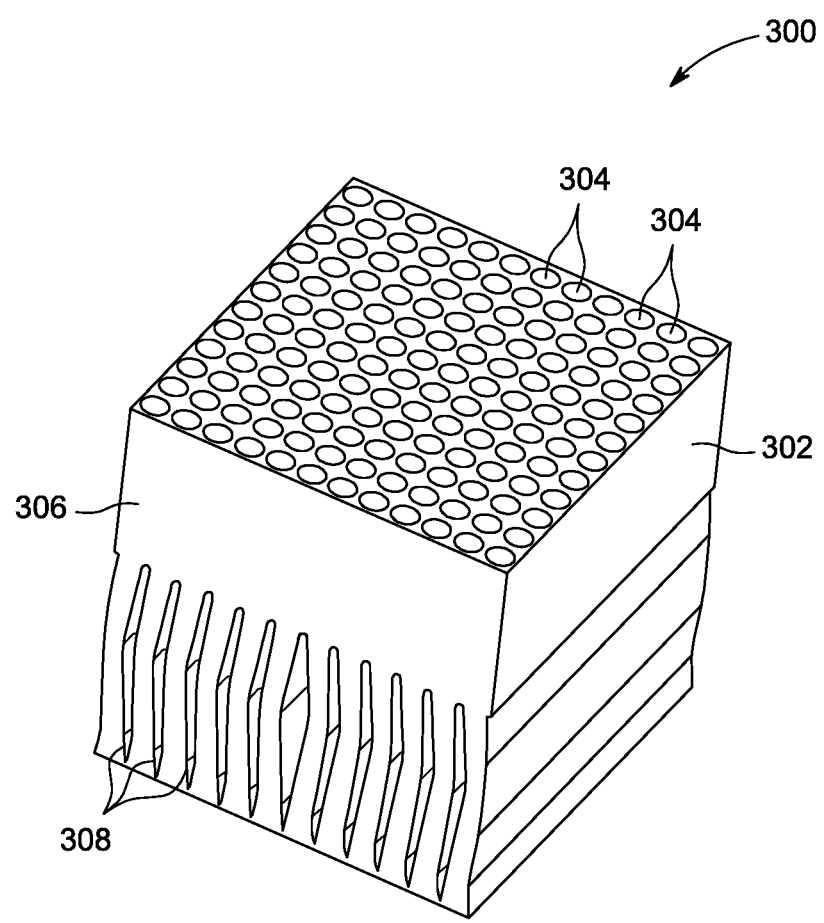
FIGS. 3A-3B depict exemplary acoustic blocks.
Figure 3B:
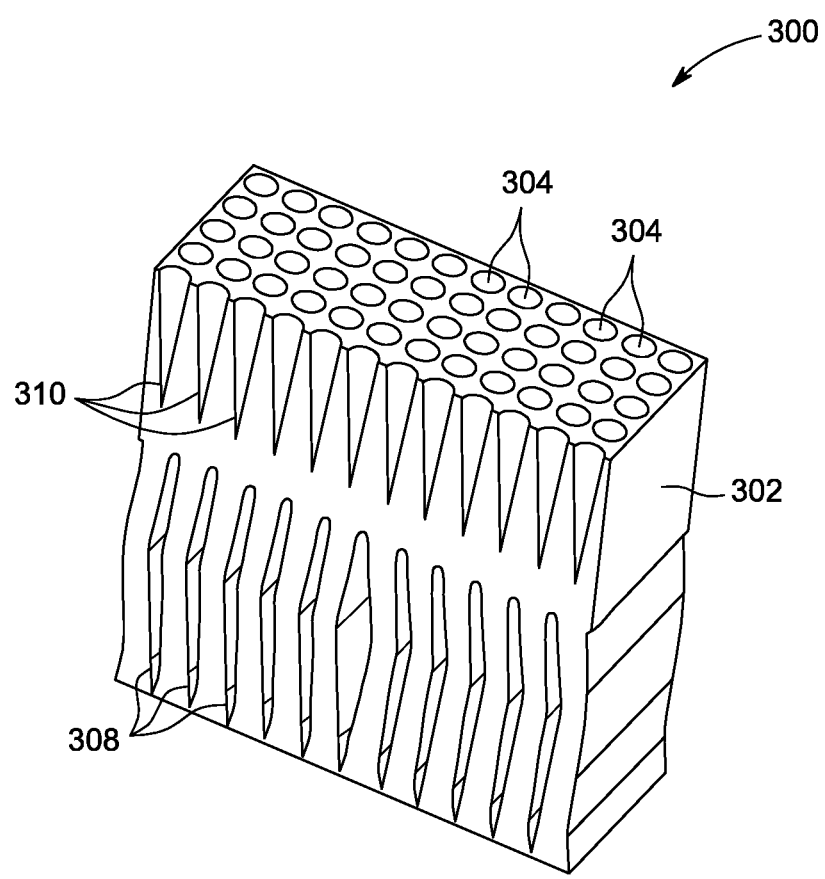

FIGS. 3A-3B depicts an acoustic block 300 for an ultrasonic sensor. The acoustic block 300 may be made of one or more metals or plastic materials, and may be used as a backing block assembly for an ultrasonic transducer. The acoustic block 300 may include different portions having different acoustic properties. For example, portion 302 may include a first material or a first phase of a same material that surrounds cone-shaped portions 310 (see FIG. 3B) that have bases 304, which may be formed of a second material or a second phase of a same material. By adjusting the porosity, material, hardness, etc., of the portions 302, 304, the acoustic block 300 can be designed to reflect or absorb ultrasonic signals emanating from an ultrasonic transducer. In addition, through the use of additive manufacturing, hollow portions 308 which open on surface 306 of the acoustic block 300 may be used to disperse acoustic energy and eliminate backing echoes.

Figure 4:
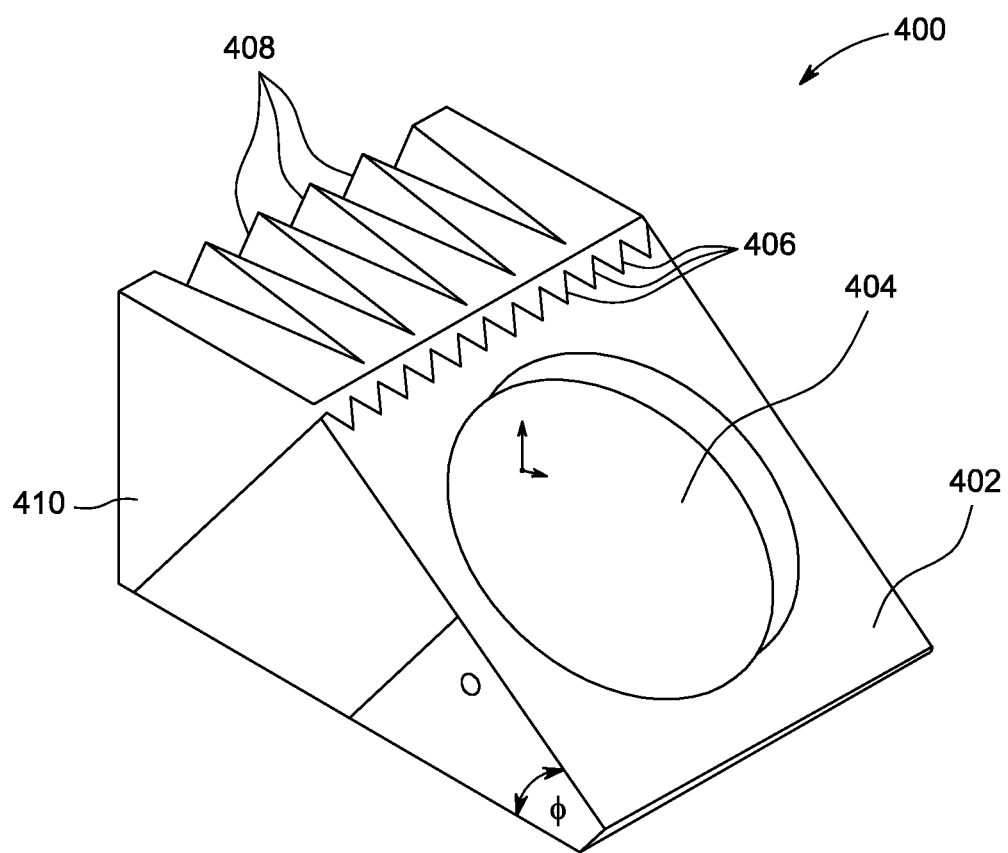
FIG. 4 depicts an ultrasonic probe wedge assembly.

FIG. 4 depicts an ultrasonic wedge assembly 400. An ultrasonic probe may contact a surface 404 of the wedge assembly, and may be used to inspect a target object at an angle θ. The wedge assembly 400 includes a region of high ultrasonic attenuation 408 and a region of low ultrasonic attenuation 402 separated by a region of medium ultrasonic attenuation 406. The configuration of the different regions 402, 406, 408 of the ultrasonic wedge can allow for reduced reflections of the ultrasonic signals during inspection of the target object.

Figure 5:
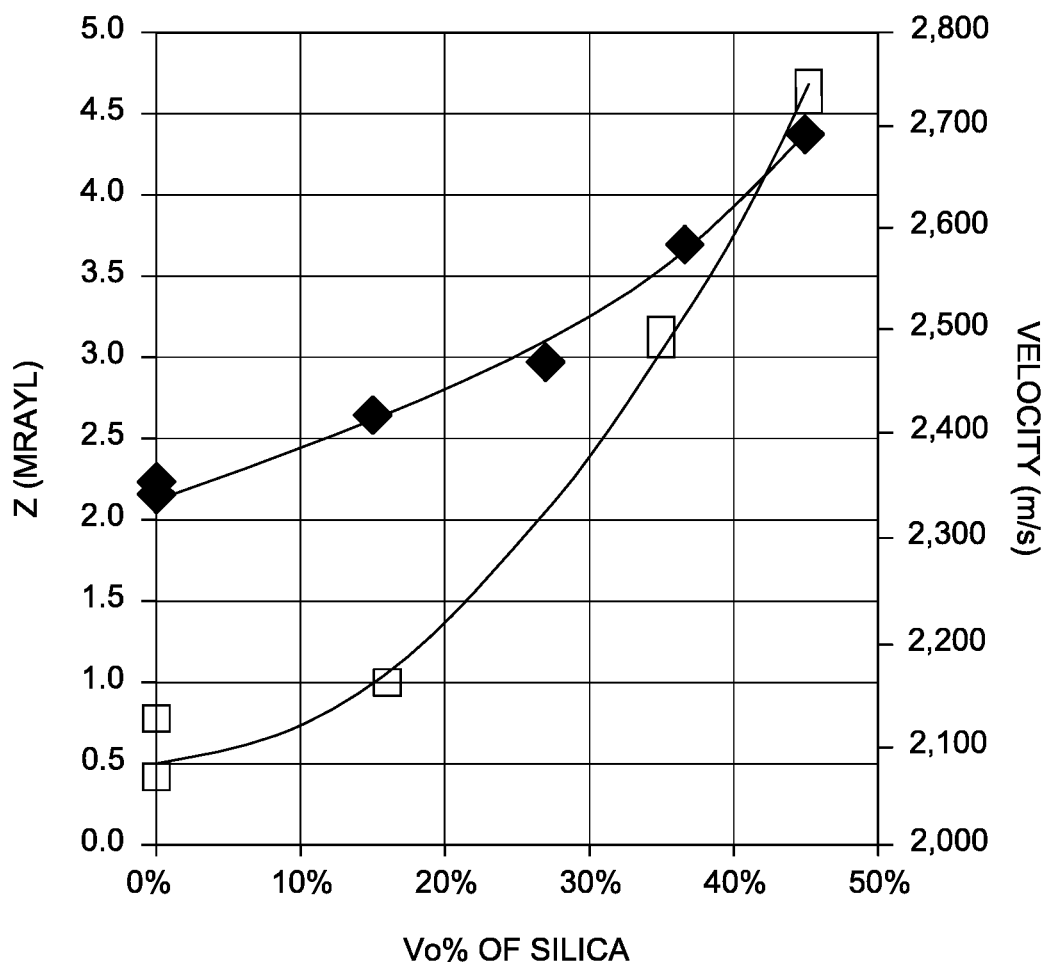
FIG. 5 is a graph illustrating the impedance and speed of sound in a material as a function of the density of the material.

FIG. 5 is a graph illustrating the impedance and speed of sound in a silica epoxy material as a function of the density of the material. By way of example, as the volume percentage of silica increases, the velocity of sound and the impedance of the material varies. Different portions of an ultrasonic transducer assembly may be formed using different silica volume percentages, and the assembly may be digitally controlled in real time to provide the needed acoustic properties.

Figure 6:
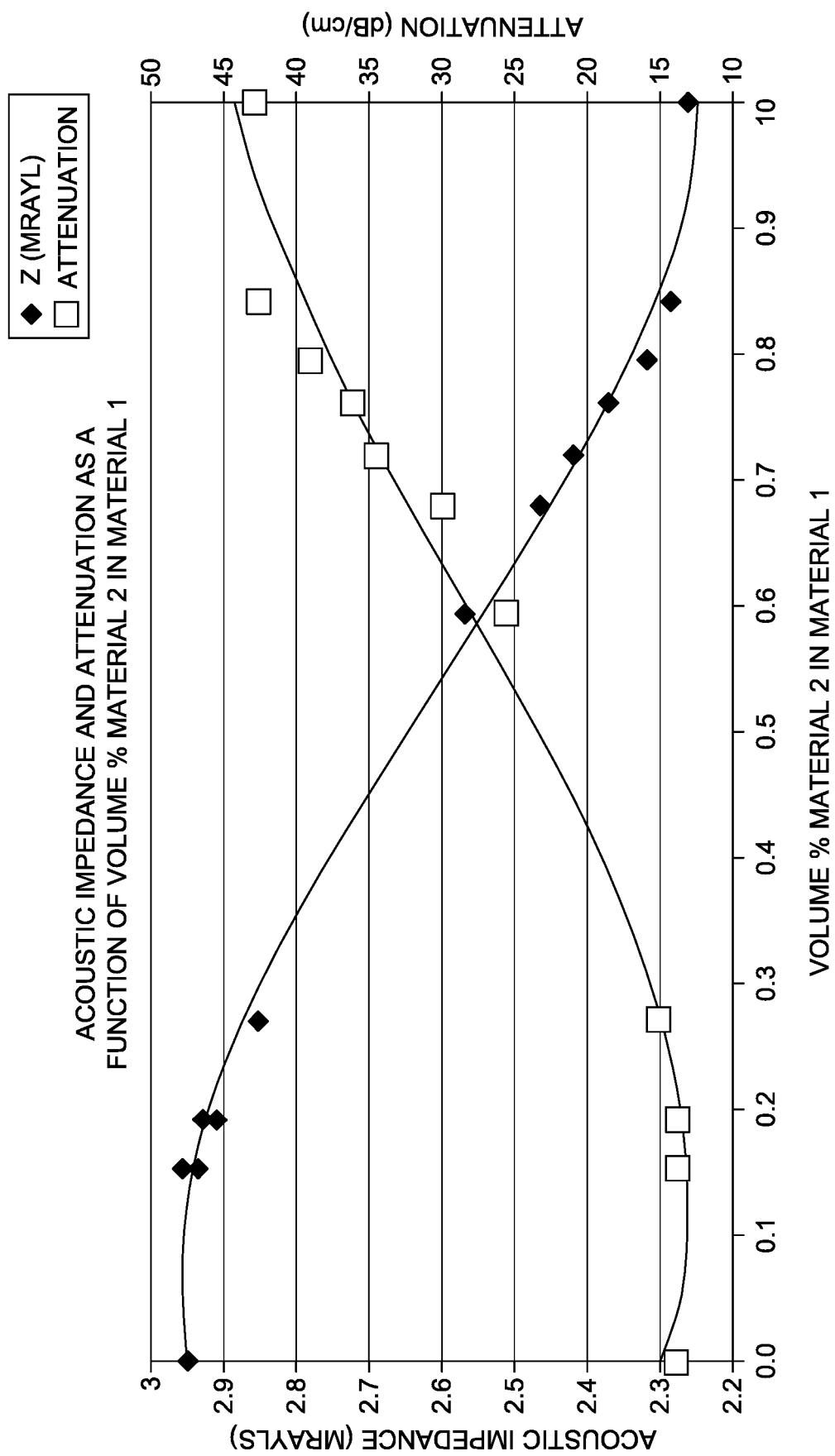
FIG. 6 is a graph illustrating the impedance and attenuation in a material as a function of material properties.

FIG. 6 is a graph illustrating the impedance and attenuation in a material as a function of material properties. For example, the 3D printer may be configured to change the volume percentage of a second material in a mixture of a first and second material. In such a case, the acoustic properties will change as the volume percentage is changed, allowing different portions of the housing to have different acoustic properties. In the depicted graph of FIG. 6, as the volume of the second material varies from 0.0 to 10, the attenuation varies between approximately 12 and 45 dB/cm. In addition, the acoustic impedance varies from approximately 2.2 to 3 MRayl (mega Rayleigh units of acoustic impedance).

Figure 7:
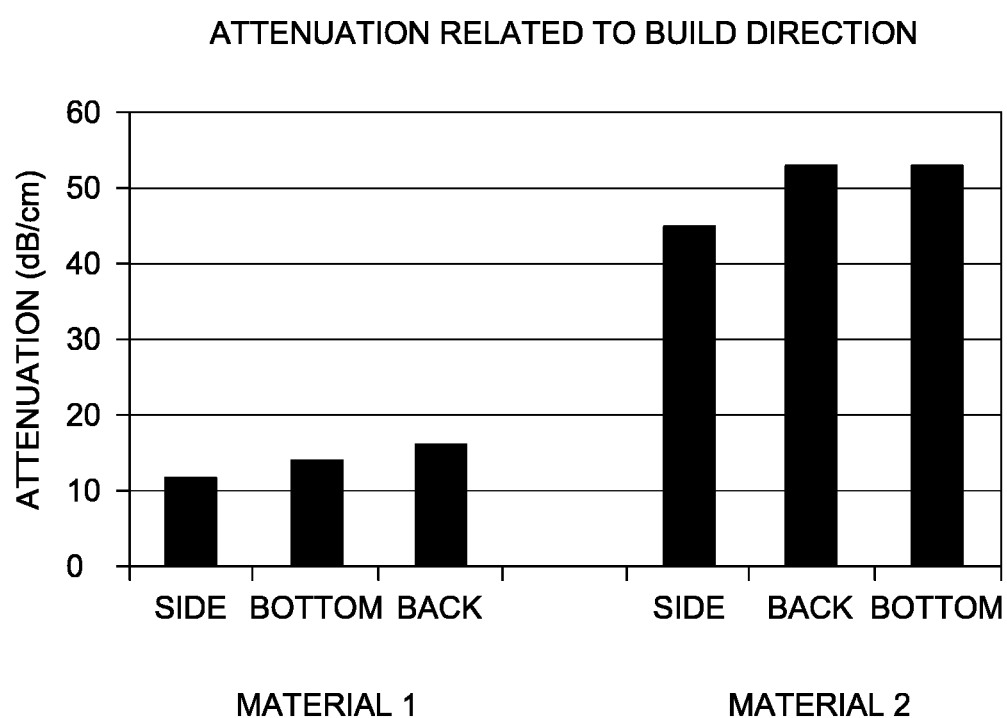
FIG. 7 is a graph illustrating attenuation in a material as a function of build direction.

FIG. 7 is a graph illustrating attenuation in a material as a function of build direction. As illustrated in FIG. 7, attenuation of a first material can vary between approximately 10 and 15 dB/cm, and a second material can vary between approximately 45 and 55 dB/cm, depending on whether the build direction is to the side, bottom or back.

Advantageously, the 3D printer may be configured to vary the build direction of the different portions of an ultrasonic probe assembly to provide desired acoustic properties.

To the extent that the claims recite the phrase "at least one of" in reference to a plurality of elements, this is intended to mean at least one or more of the listed elements, and is not limited to at least one of each element. For example, "at least one of an element A, element B, and element C," is intended to indicate element A alone, or element B alone, or element C alone, or any combination thereof. "At least one of element A, element B, and element C" is not intended to be limited to at least one of an element A, at least one of an element B, and at least one of an element C.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for manufacturing an assembly for an ultrasonic probe, the method comprising;
   additively forming first portions of the assembly using a first material with first acoustic properties and second portions of the assembly using a second material with second acoustic properties, the first and second acoustic properties being configured to modify ultrasonic signals of an ultrasonic probe, wherein the assembly comprises a housing for the ultrasonic probe; and
   the additively forming further comprises forming a fluid channel for receiving fluid within the housing.

2. The method of claim 1, further comprising:
   determining acoustic properties of a target of the ultrasonic probe; and
   selecting at least one of the first acoustic properties of the first portions of the assembly or the second acoustic properties of the second portions of the assembly to match the acoustic properties of the target.

3. The method of claim 1, wherein the first material and the second material are a same material and the additively forming comprises forming the first portions with a first phase of the same material and the second portions with a second phase of the same material.

4. The method of claim 3, wherein the first phase comprises a first volume percentage of the same material and the second phase comprises a second volume percentage of the same material.

5. The method of claim 1, wherein the first material and the second material are different materials.

6. The method of claim 1, wherein the assembly comprises a case, a wedge, or a housing.

7. The method of claim 1, wherein the additively forming further comprises forming the first portion of the assembly with first fluidic properties and the second portion of the assembly with second fluidic properties.

8. The method of claim 7, wherein at least one of the first portions or the second portions of the assembly comprise a cavity.

9. The method of claim 1, wherein the first and second acoustic properties of the assembly are configured to reduce ultrasonic reflections from the ultrasonic probe.

10. The method of claim 1, wherein the additively forming comprises forming at least one cavity in the assembly.

11. The method of claim 1, further comprising selecting at least one of the first acoustic properties of the first portions of the assembly or the second acoustic properties of the second portions of the assembly to match acoustic properties of the ultrasonic probe.

12. A method for manufacturing a housing for an ultrasonic probe, the method comprising:
   determining acoustic properties of a target of the ultrasonic probe; and
   additively forming
      first portions of the housing using a first material with first acoustic properties,
      second portions of the housing using a second material with second acoustic properties, the first and second acoustic properties being configured to modify ultrasonic signals of the ultrasonic probe, and
      a fluid channel for receiving fluid within the housing of the ultrasonic probe and at least one cavity within the housing.

13. The method of claim 12, wherein the first material and the second material are a same material and the additively forming comprises forming the first portions with a first phase of the same material and the second portions with a second phase of the same material.

14. The method of claim 13, wherein the first phase comprises a first volume percentage of the same material and the second phase comprises a second volume percentage of the same material.

15. The method of claim 12, wherein the first material and the second material are different materials.

16. The method of claim 12, wherein the first and second acoustic properties of the assembly are configured to reduce ultrasonic reflections from the ultrasonic probe.

* * * * *